United States Patent [19]

Yanase et al.

[11] 4,370,292

[45] Jan. 25, 1983

[54] ENCAPSULATION OF ELECTRONIC DEVICE

[75] Inventors: Hiroshi Yanase; Fukuo Kanno; Takeshi Abe, all of Yokohama, Japan

[73] Assignee: Asahi Glass Company, Ltd., Tokyo, Japan

[21] Appl. No.: 270,233

[22] Filed: Jun. 4, 1981

[30] Foreign Application Priority Data

Jul. 4, 1980 [JP] Japan .................................. 55-90714

[51] Int. Cl.³ .............................................. B29C 6/00
[52] U.S. Cl. ......................... 264/272.11; 264/272.17; 264/272.18; 264/272.19; 264/328.18; 264/331.12; 525/474; 525/523; 525/534; 525/537
[58] Field of Search ...................... 264/272.11, 328.18, 264/331.12, 272.13, 272.17, 272.18, 272.19; 525/537, 474, 523, 534

[56] References Cited

U.S. PATENT DOCUMENTS

| | | | |
|---|---|---|---|
| 3,839,301 | 10/1974 | Scoqqins | 525/537 |
| 3,941,751 | 3/1976 | Breslow | 525/537 |
| 3,998,767 | 12/1976 | Walton . | |
| 4,021,596 | 5/1977 | Bailey | 525/537 |

FOREIGN PATENT DOCUMENTS

| | | |
|---|---|---|
| 52-149348 | 12/1977 | Japan . |
| 53-22363 | 3/1978 | Japan . |
| 53-66565 | 6/1978 | Japan . |
| 55-45704 | 3/1980 | Japan .................................. 525/537 |
| 1526159 | 9/1978 | United Kingdom . |

OTHER PUBLICATIONS

"Materials for Electronics", *Electronics*, Oct. 56, pp. 188-191.

Primary Examiner—James B. Lowe
Attorney, Agent, or Firm—Oblon, Fisher, Spivak, McClelland & Maier

[57] ABSTRACT

An encapsulation of an electronic device is carried out by using a synthetic thermoplastic resin compound having low viscosity in a molding condition which comprises polyphenylene sulfide and a filler at a ratio of 1:4 to 4:1 and a tacky or adhesive polymer at a ratio of 0.1 to 50 wt. parts per 100 wt. parts of polyphenylene sulfide by a transfer molding process or an injection molding process.

6 Claims, 3 Drawing Figures

ENCAPSULATION OF ELECTRONIC DEVICE

BACKGROUND OF THE INVENTION

1. Field of the Invention

The present invention relates to an encapsulation of an electronic device. More particularly, it relates to an encapsulation by a molding process with a compound comprising polyphenylene sulfide.

2. Description of the Prior Arts

It is known to encapsulate electronic devices with synthetic resins in various fields for the purposes of electric insulation, mechanical protection and prevention of characteristic deterioration in the atmosphere of IC, transistors, diodes, coils, capacitors, resistors, varistors and connectors. Thermosetting resins such as epoxy resin and silicone resin have been used as the synthetic resin. The encapsulation has been carried out by a casting process, a potting process, a dipping process and a molding process. The molding process such as transfer molding or injection molding is the most advantageous because it has high efficiency in the operation, easiness of the handling of the synthetic resins and high accuracy. In general, such molding process requires high molding pressure and was difficult to be applied to encapsulation of fine electronic devices.

In order to overcome such difficulties, a synthetic resin having high melt flow property and low melt viscosity is required. Thermosetting resin compounds such as epoxy or silicone compounds having low melt viscosity have been developed and used for encapsulation in the molding process.

These thermosetting compounds still have disadvantages that a toxic crosslinking agent is used; a complicated formulation is required comprised of many kinds of additives; a handling of a liquid resin is troublesome; a storage stability of a compound is not satisfactory; a long molding time is required to cure resin chemically in a mold; a flash is not easily removed; and cleaning of mold is not easy. Therefore, an encapsulation with a thermoplastic resin compound has been desired.

The fact that polyphenylene sulfide is a suitable thermoplastic resin for encapsulation and various disadvantages caused by the conventional thermosetting compounds can be overcome by using thermoplastic compounds comprising polyphenylene sulfide and a filler have been disclosed in Japanese Unexamined Patent Publication Nos. 149348/1977; 22363/1978 and 66565/1978 (Asahi Glass).

The inventors have further studied industrial applications of the encapsulation with these compounds and have found that a handling of the compounds is easy and molding properties are excellent in the encapsulation process and the molded products have excellent mechanical properties and electric properties, but that, electric resistance of the molded product in humid environment is not satisfactory. That is, if the electronic part is encapsulated with a polyphenylene sulfide compound of the prior art and exposed in a high humid environment, it has been found that moisture penetrates along an interface between a lead and encapsulation material to cause electric leakage, corrosion and in extreme cases, a disconnection of the circuit.

SUMMARY OF THE INVENTION

It is an object of the present invention to provide an encapsulation of an electronic device without said disadvantages.

The foregoing and other objects of the present invention have been attained by providing an encapsulation of an electronic device with a synthetic resin compound wherein said synthetic resin compound is a thermoplastic compound having low viscosity in the molding process which comprises polyphenylene sulfide and a filler at a ratio of 1:4 to 4:1 and a tacky or adhesive polymer at a ratio of 0.1 to 50 wt.parts per 100 wt.parts of polyphenylene sulfide and said encapsulation is carried out by a transfer molding process or an injection molding process.

Figure 1:
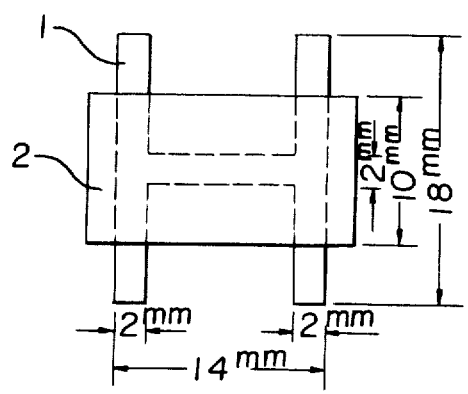
FIG. 1 is a plane view of a specimen for testing an electric resistance in humid environment.

In the drawings, the reference 1 designates a metallic substrate and 2 designates a thermoplastic compound for encapsulation.

DETAILED DESCRIPTION OF THE PREFERRED EMBODIMENTS

The polyphenylene sulfide used in the present invention is a thermoplastic resin having the formula

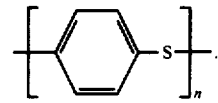

(referring to as PPS)

and is moldable as in the same manner as the other thermoplastic resins.

PPS is durable, for a long time at a temperature upto 260° C. and has high chemical resistance, nonflammable property, high insulating property and low dielectric tangent and has high strength and hardness similar to metals. PPS is classified into non-crosslinked PPS and crosslinked PPS. A melt viscosity of PPS increases depending upon an increase of crosslinkage degree. A melt viscosity of the non-crosslinked PPS measured by a dice having a diameter of 0.5 mm and a land length of 1.0 mm at 300° C. under an extrusion pressure of 30 kg/cm$^2$ is $3 \times 10^3$ poise or lower. The lower crosslinked PPS useable in the present invention has a melt viscosity of $3 \times 10^4$ poise or lower, preferably $5 \times 10^3$ poise or lower.

As the commercially available PPS, Ryton manufactured by Phillips Petroleum Co. has been widely known. "Ryton" PPS is classified into 5 types of V-1, P-2, P-3, P-4 and R-6 depending upon its crosslinkage degree. The optimum grade for low melt viscosity is V-1 grade as noncrosslinked PPS and P-2 and P-3 grade as lower crosslinked PPS.

In the present invention, V-1, P-2 or P-3 grade can be used by itself or a mixture thereof. It is also possible to use a mixture of P-4 and V-1 grades. It is also possible to use PPS obtained by a heat-treatment of a partially crosslinked PPS or noncrosslinked PPS in the substantial absence of oxygen at least 290° C. in view of good moldability and physical properties of a molded product as described in Japanese Unexamined Patent Publication No. 155,300/1979.

In the present invention, the filler is used for improvement of dimensional stability, thermal conductivity and mechanical strengths of molded products. Various fillers can be used and are not critical. It is, however, desirable to select the filler excepting those which decompose in the encapsulation molding temperature or have electric conductivity by themselves or contain ionic impurities or are hygroscopic in order to maintain electric insulation of the compound. The form of the filler can be various forms such as powder, grain and fiber.

Suitable fillers in a form of powder or grain include silica powder, clay, calcined clay, calcium carbonate, talc, glass powder, glass beads, glass baloon, silica baloon, alumina and wollastonite. It is optimum to use silica powder having high purity in view of low coefficient of thermal expansion and absence of noxious ionic impurities. Suitable fillers in a form of fiber include inorganic fibers such as glass fiber, milled glass fiber, asbestos, and ceramic fiber; and heat resistant organic fibers such as aromatic polyamide fibers. It is optimum to use glass fiber or milled glass fiber in view of easiness of availability and handling property. The filler can be of one kind or blend of more kinds of the fillers. It is also possible to use a combination of the filler having a powder or grain form and the filler having a fiber form such as a combination of silica powder having high purity and milled glass fiber.

It is preferable to treat the filler with a surface modifier such as silicone coupling agent such as epoxysilane, aminosilane, mercaptosilane and vinylsilane or a titanate coupling agent so as to improve the affinity of the filler to the resin.

In the present invention, a ratio of polyphenylene sulfide to the filler is in a range of 1:4 to 4:1. When the ratio of the filler is less than the lower limit, the dimensional variation in the molding process is too much and the dimensional accuracy is too low and the improved effects for thermal conductivity, mechanical strength and dimensional stability of the molded product are not satisfactory. When the ratio of the filler is more than the upper limit, a melt flow property of the compound is too poor to attain a smooth encapsulation molding. Formulations that deviate from the range above described are disadvantageous.

In the present invention, it is important to incorporate a specific amount of the tacky or adhesive polymer in the thermoplastic compound for encapsulation.

Such polymer improves adhesive property of the encapsulation material to a circuit or a lead in an electronic device in the step of the encapsulation molding. The electric resistance in humid environment of the encapsuled electronic device is remarkably improved in the presence of the tacky or adhesive polymer.

In the present invention, it is preferable to use the tacky or adhesive polymer having a melting point or a softening point of 200° C. or lower and a 5% weight loss temperature of at least 300° C. measured at a temperature rising rate of 10° C./min. in air in view of easy handling of preparation of the compound pellets; a reduction of foaming in an encapsulation molding; or an effect on electric resistance improvement in humid environment. The optimum result is attained by using the polymer selected from the group consisting of phenoxy resins, epoxy resins and silicone resins.

The phenoxy resins suitable for the tacky or adhesive polymer used in the present invention can be produced by using Bisphenol A and epichlorohydrine as main components as similar to the following epoxy resins except that the phenoxy resin has no terminal epoxy groups and is thermoplastic. It is preferable to use phenoxy resins as Bakelite manufactured by UCC in USA which have a softening temperature of about 100° C. and a molecular weight of about $2.5 \times 10^4$-$3.5 \times 10^4$.

The epoxy resins used in the present invention can be typical epoxy resins as linear polycondensates of Bisphenol A and epichlorohydrine and modifications thereof using a halogenized Bisphenol A resorcine or Bisphenol F instead of Bisphenol A or Novolac type epoxy resins; polyalcohol type epoxy resins; and polyglycol type epoxy resins etc. Various epoxy resin prepolymers from a liquid form at room temperature to a solid form having a melting point of about 150° C. are obtained depending upon a molecular weight thereof. It is preferable to use a solid one at room temperature having relatively high molecular weight in view of easy handling property and a reduction of foaming in a molding process.

In the conventional process, it is usual to incorporate a curing agent such as amines, acid anhydrates and polysulfides into an epoxy resin. In the process of the present invention, it is preferable that no curing agent is incorporated or only a small amount of a curing agent insufficient for complete curing is incorporated. If a large amount of a curing agent is incorporated, the epoxy resin component is hardened completely in the preparation of the compound pellets or in the mixing operation in a barrel before the encapsulation whereby the adhesive property of the component to an IC circuit or a lead in the step of the encapsulation is lost. When a curing agent is not incorporated or only a small amount of a curing agent is incorporated, the adhesive property in the encapsulation is maintained and a reuse of runner and sprue can be also expected.

The silicone type polymers used in the present invention should have tacky or adhesive property. It is preferable to use commercially available silicone tackifiers and silicone adhesives as basical resin components in various formulations.

It is especially preferable to use silicone resins having bonds of

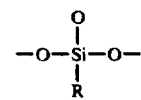

or modified silicone resins which are obtained by modifying said silicone resin by introducing linear segments having bonds of

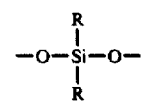

or chemically bonding an alkyd. Silicone type polymers having no tacky or adhesive property such as silicone oil, and condensates of a silane coupling agent are not suitable.

In the conventional process, it is usual to incorporate a curing agent or a hardening catalyst in a silicone type polymer as in the case of the epoxy resin. In the process of the present invention, it is preferable that a curing agent is not incorporated or only a small amount of a curing agent is incorporated in view of the same reason described for the epoxy resins.

In the present invention, the tacky or adhesive polymer is incorporated at a ratio of 0.1 to 50 wt.parts preferably 0.5 to 20 wt. parts per 100 wt.parts of PPS. When the ratio of the tacky or adhesive polymer is too small, the effect of the addition is not satisfactory whereas when it is too much, rigidity of the molded product at high temperature is lost. These are disadvantageous.

In the resin compound used for the encapsulation of the present invention, it is possible to incorporate a small amount of an additive such as pigments and inner lubricants without deviating from the purposes for the present invention. The resin compound preferably has an apparent viscosity of $1 \times 10^2$ to $8 \times 10^3$ poise measured by using a dice having a diameter of 0.5 mm and a land length of 1.0 mm under an extrusion pressure of 30 kg/cm$^2$ at 300° C.; especially $5 \times 10^3$ poise or lower measured in the same condition for the encapsulation of fine electronic device.

In the mixing for the preparation of the resin compound in the present invention, various processes can be possible. The conventional dry or wet process applied for mixing resin compounds can be employed. For example, the filler and PPS at a desired ratio are mixed by a dry blend in a V-shape blender or a Henschel mixer and the mixture is melt-extruded by an extrusion machine to mix them in the molten condition to prepare pellets of a mixture of PPS and the filler and then the pellets are mixed with the tacky or adhesive polymer or a dispersion or solution thereof. When the dispersion or solution is used, the medium or solvent of the dispersion or solution is separated and the remainder is melt-extruded by an extrusion machine to prepare pellets containing all components. All of the components can also be mixed in an organic solvent or an aqueous solution of a surface active agent.

The encapsulation of the present invention can be carried out by a molding process of a transfer molding process or an injection molding process. In the process, electronic devices are kept in a mold and the mold is closed and a synthetic resin is charged and the mold is opened at the final stage of molding to take out the molded product. In the case of a thermosetting resin, the mold must be kept closed during a time required for curing after the charge of the resin, however, in the case of a thermoplastic resin such as PPS, the molding time can be shortened because a time only for cooling is required.

The condition for the molding is different depending upon kinds and shapes of electronic devices and kinds and ratio of PPS and the filler. The molding process is usually carried out under the following condition.

Molding pressure: 5 to 100 kg/cm$^2$ preferably 10 to 50 kg/cm$^2$

Barrel temperature: 280° to 360° C. preferably 300° to 350° C.

Die temperature: 80° to 250° C. preferably 130° to 220° C.

In the process of the present invention, the tacky or adhesive polymer is used as one component for the thermoplastic compound whereby the electric resistance in humid environment of the encapsulation product is remarkably improved without causing sticking of the encapsulation product to the mold. The reason is not clearly known but is considered to be as follows. It only requires a relatively small adhesive force for inhibiting penetration of moisture along the interface between the resin compound matrix and a lead, an IC circuit or a metallic part because the external force is not substantially applied. Therefore, the adhesive property in the present invention does not cause a defect in demolding of the molded product. Moreover, the solidification of the encapsulation product in the mold is initiated from the side of the product contacting the mold. The tacky or adhesive polymer incorporated has a lower melting point than that of PPS whereby the tacky or adhesive polymer is concentrated in the central part of the product in the melting condition. The present invention is not limited by such description.

In accordance with the present invention, the encapsulation product having excellent electric resistance in humid environment can be effectively molded and moreover, the runner and sprue portions can be reused to provide the encapsulation method with excellent saving of raw material sources.

The present invention will be further illustrated by certain examples and references which are provided for purposes of illustration.

The methods of evaluation of the electric resistance in humid environment will be illustrated referring to the drawings.

Figure 2:
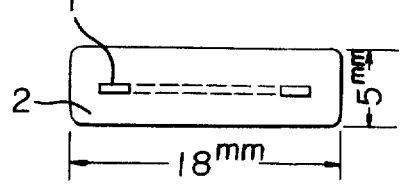
FIG. 2 is a front view of said specimen.

As a specimen for evaluation of the electric resistance in humid environment, a specimen shown in FIG. 1 (plane view) and FIG. 2 (front view) is prepared. In the drawings, the reference 1 designates an aluminum plated iron-nickel alloy piece having a thickness of 0.3 mm and 2 designates a thermoplastic compound for encapsulation.

Figure 3:
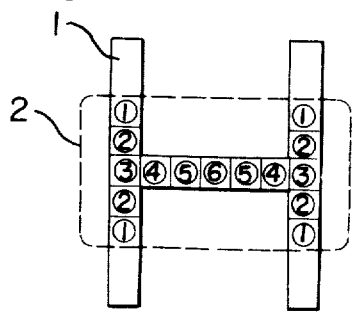
FIG. 3 shows a test method of evaluation of the electric resistance in humid environment.

In the preparation of the specimen, an injection molding machine for inserted parts (manufactured by Toho Press Co. Ltd.; a maximum clamping force of 20 ton; a maximum injection capacity of 80 cm$^3$; a screw diameter of 34 mm and a maximum injection pressure of 150 kg/cm$^2$) is used and a thermoplastic compound is fed into a mold with an alloy substrate previously set by an insert injection molding under the condition of a barrel temperature of 310° C.; an injection pressure of 70 kg/cm$^2$; and a mold temperature of 150° C. The resulting specimen is boiled in an aqueous red ink (manufactured by The Pilot Pen Co. Ltd.) at a specific temperature for a specific time. The resin compound for encapsulation is removed and the degree of penetration of the red ink is observed. The six sections ① to ⑥ shown in FIG. 3 are set for each 2 mm of the distance from the edge face of the encapsulation. The section ⑥ shows the aluminum plated surface at the center of the encapsulation product.

In view of the experimental finding that the degree of the penetration of the moisture from the edge face of a lead of the electronic devices in the encapsulation is highly related to the electric resistance in humid environment of the encapsulation product and the electric resistance in humid environment is higher depending upon a decrease of the penetration of the moisture, the electric resistance in humid environment is evaluated by measuring the penetration of the moisture as a simple evaluation.

EXAMPLES 1 TO 3 AND REFERENCE 1

1.4 Kg of polyphenylene sulfide powder (PPS) (Ryton P-4; manufactured by Phillips-Petroleum Co.; a melt viscosity of 1900 poise measured at 300° C. under a pressure of 50 kg/cm$^2$) and 0.6 kg of PPS (Ryton V-1; a melt viscosity of 120 poise measured at 300° C. under a pressure of 10 kg/cm$^2$) and 1.0 kg of milled glass fiber (manufactured by Asahi Fiber Glass Co. Ltd. MF-A; a diameter of 10μ and a length of 30 to 100μ) which was treated by a surface treatment with aminosilane surface treatment agent (manufactured by Nippon Unicar Co. A-1100) and 1.5 kg of silica powder having high purity (manufactured by Tatsumori Co. Ltd. Fuselex E-1; particle diameter of 1-50μ) which was surface treated by the same were charged in a 10 liter V-shape blender. The mixture was blended at a rate of 60 rpm. for 10 minutes. The mixture was charged into an monoscrew extrusion machine having a screw diameter of 40 mm to extrude it at a barrel temperature of about 300° C. and a dice temperature of about 300° C. and at a screw rotation rate of 30 rpm. so as to obtain pellets. The pellets had an apparent melt viscosity of 3000 poise at 300° C. under an extrusion pressure of 30 kg/cm$^2$.

The resulting pellets were admixed with each of a phenoxy resin, an epoxy resin and a silicone resin at a ratio of 5 wt.parts part 100 wt.parts of PPS to prepare pellets of each resin compound. Each specimen for the electric resistance in humid environment was prepared from the pellets of each resin compound. The tests for penetration of an aqueous red ink were carried out for five specimens for each resin compound, under the condition boiling at 100° C. for 72 hours. The results are shown in Table 1. As a reference, specimens having no additional resin were also tested.

Phenoxy resin
Bakelite (TM) phenoxy resin PKHH grade manufactured by Union Carbide Co. molecular weight of 25,000–35,000; specific gravity of 1.17–1.19; softening temperature of 100° C.; 5% weight loss temperature of 385° C.

Epoxy resin
Epicoat (TM) 1009 manufactured by Shell Petro. Co. melting point of 140°–155° C.; 5% weight loss temperature of 385° C. thermoset adhesive agent solid at room temperature.

Silicone resin
Toshiba Silicone YR 3340 (manufactured by Toshiba Silicone Co. Ltd.) solution of 40 wt.% of silicone resin in a mixed solvent of toluene and xylene which has a viscosity of 120–160 poise at 25° C. In the example, the solvent was separated before adding to PPS compound. The solid obtained by separating the solvent was jelly at room temperature. 5% weight loss temperature of 325° C.

TABLE 1

| | Additional polymer | Degree of penetration of red ink |
|---|---|---|
| Example 1 | Phenoxy resin | to half of section ② |
| Example 2 | Epoxy resin | " |
| Example 3 | Silicone resin | " |
| Reference | none | sections ①, ⑥ deep coloring in sections ①, ② |

EXAMPLES 4 TO 7 AND REFERENCE 2

2.0 Kg of polyphenylene sulfide (PPS) (Ryton P-2 manufactured by Phillips-Petroleum Co.; a melt viscosity of 2500 poise measured at 300° C. under a pressure of 10 kg/cm$^2$) and 0.5 kg of milled glass fiber (manufactured by Asahi Fiber Glass Co. Ltd. MF-A) which was surface-treated same as Examples 1 to 3, and 2.5 kg of silica powder having high purity (manufactured by Tasumori Co., Ltd. Fuselex E-1) which was surface-treated same as Examples 1 to 3 were blended with phenoxy resin (manufactured by Union Carbide Co. PKHH grade) at each ratio shown in Table 2, to prepare each PPS resin compound. Each specimen for the test of electric resistance in humid environment was prepared by molding pellets of each resin compound.

Five specimens for each resin compound were charged in an aqueous red ink in an autoclave and continuously immersed at 125° C. under higher pressure for 7 days. After opening the autoclave, the specimens were observed. The results are shown in Table 2.

As a reference, specimens of encapsulation products having no phenoxy resin were also tested.

It is found the fact that the electric resistance in humid environment is remarkably improved by an addition of the adhesive resin in the present invention.

TABLE 2

| | Content of phenoxy resin (wt. part per 100 wt. part of PPS) | Degree of penetration of red ink (125° C., 7 days) |
|---|---|---|
| Example 4 | 20 | to section ① |
| Example 5 | 5 | " |
| Example 6 | 2.5 | " |
| Example 7 | 0.5 | to section ①, 3 spec. to section ②, 2 spec. |
| Reference | 0 | sections ①, ⑥ |

We claim:
1. In an encapsulation of an electronic device with a synthetic resin compound, an improvement characterized in that said synthetic resin compound is a thermoplastic compound having low viscosity in a molding process which comprises polyphenylene sulfide and a filler at a ratio of 1:4 to 4:1 and a tacky or adhesive polymer to restrict moisture penetration at a ratio of 0.1 to 50 wt. parts per 100 wt. parts of polyphenylene sulfide and said encapsulation is carried out by a transfer molding process or an injection molding process, wherein said tacky or adhesive polymer is at least one selected from the group consisting of phenoxy resins, epoxy resins and silicone resins, and wherein said silicone resins have bonds of

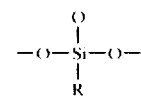

or bonds of

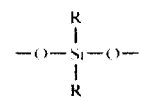

2. The encapsulation according to claim 1 wherein said tacky or adhesive polymer has a melting point or softening point of 200° C. or lower and a 5% weight loss temperature of at least 300° C. measured at a temperature rising rate of 10° C./min. in air.

3. The encapsulation according to claim 1 wherein said thermoplastic compound has an apparent viscosity of $1 \times 10^2$ to $8 \times 10^3$ poise measured by using a dice having a diameter of 0.5 mm and a land length of 1.0 mm under an extrusion pressure of 30 kg/cm$^2$ at 300° C.

4. The encapsulation according to claim 1 wherein said molding process is a transfer molding process or an injection molding process under conditions of a molding pressure of 5 to 100 kg/cm$^2$, a barrel temperature of 280° to 360° C. and a die temperature of 80° to 250° C.

5. The encapsulation according to claim 1 wherein at least part of said filler is a silica powder having high purity.

6. The encapsulation according to claim 1 wherein said tacky or adhesive polymer is a phenoxy resin.

* * * * *